(12) United States Patent
Liao et al.

(10) Patent No.: US 11,740,260 B2
(45) Date of Patent: Aug. 29, 2023

(54) POGO PIN-FREE TESTING DEVICE FOR IC CHIP TEST AND TESTING METHOD OF IC CHIP

(71) Applicants: Global Unichip Corporation, Hsinchu (TW); Taiwan Semiconductor Manufacturing Company, Ltd., Hsinchu (TW)

(72) Inventors: Chih-Chieh Liao, Hsinchu (TW); Yu-Min Sun, Hsinchu (TW); Chih-Feng Cheng, Hsinchu (TW); Pei-Shiou Huang, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 17/571,537

(22) Filed: Jan. 10, 2022

(65) Prior Publication Data

US 2023/0160925 A1    May 25, 2023

(30) Foreign Application Priority Data

Nov. 24, 2021 (TW) ................................. 110143654

(51) Int. Cl.
   *G01R 1/073* (2006.01)
   *G01R 1/067* (2006.01)

(52) U.S. Cl.
   CPC ..... *G01R 1/07314* (2013.01); *G01R 1/06755* (2013.01)

(58) Field of Classification Search
   CPC ............. G01R 1/07314; G01R 1/06755
   See application file for complete search history.

(56) References Cited

U.S. PATENT DOCUMENTS

| 5,603,619 A | * | 2/1997 | Turner | ............... | H01R 12/714 |
| | | | | | 439/67 |
| 9,040,986 B2 | | 5/2015 | Chen et al. | | |

(Continued)

FOREIGN PATENT DOCUMENTS

| CN | 105977180 | 5/2020 |
| TW | 201810484 | 3/2018 |

(Continued)

OTHER PUBLICATIONS

"Office Action of Taiwan Counterpart Application", dated Sep. 28, 2022, p. 1-p. 7.

*Primary Examiner* — Paresh Patel
(74) *Attorney, Agent, or Firm* — JCIPRNET

(57) ABSTRACT

A pogo pin-free testing device for IC chip test includes a load board, a ceramic interposer disposed on the load board, and copper core balls. The ceramic interposer has first and second surfaces and connecting points, and the second surface of the ceramic interposer faces the load board. Each connecting point has through holes penetrating the first and second surfaces, and an inner sidewall surface thereof has a metallization layer. The metallization layer is extended to a portion of the first surface and a portion of the second surface. In each of the connecting points, an area of an extending portion of the metallization layer extended to the second surface is less than an area of an extending portion of the metallization layer extended to the first surface. The copper core balls are disposed between the load board and the through holes of each connecting point of the ceramic interposer.

11 Claims, 9 Drawing Sheets

(56) References Cited

U.S. PATENT DOCUMENTS

| | | | |
|---|---|---|---|
| 2008/0121422 A1* | 5/2008 | Karasawa | H05K 1/115 |
| | | | 174/262 |
| 2017/0018492 A1 | 1/2017 | Imayoshi et al. | |
| 2020/0105544 A1* | 4/2020 | Tsai | H01L 21/4853 |

FOREIGN PATENT DOCUMENTS

| | | |
|---|---|---|
| TW | 201816900 | 5/2018 |
| TW | I643534 | 12/2018 |
| TW | 202139395 | 10/2021 |

* cited by examiner

POGO PIN-FREE TESTING DEVICE FOR IC CHIP TEST AND TESTING METHOD OF IC CHIP

CROSS-REFERENCE TO RELATED APPLICATION

This application claims the priority benefit of Taiwan application serial no. 110143654, filed on Nov. 24, 2021. The entirety of the above-mentioned patent application is hereby incorporated by reference herein and made a part of this specification.

BACKGROUND OF THE INVENTION

Field of the Invention

The invention relates to an integrated circuit (IC) chip testing technique, and more particularly to a pogo pin-free testing device for IC chip test and a testing method of IC chip.

Description of Related Art

IC chip test is an important part of the IC manufacturing process to ensure that the quality of chip shipments meets requirements. Especially for the testing of application-specific integrated circuits (ASICs), since ASICs are ICs with special specifications that are fully customized according to different product requirements, a tailor-made testing device is needed.

At present, most of the existing testing devices adopt testing devices having a pogo pin, wherein an ASIC chip is soldered to a test socket having a pogo pin first, then the pogo pin of the test socket is inserted onto a load board for testing. Since the pogo pin length is about 4 mm, the distance between the load board and the ASIC chip to be tested is at least 4 mm, and the contact resistance generated by adjacent pogo pins is about 70 mOhm, which leads to the IR drop effect, which is one of the factors affecting whether the ASIC chip meets requirements.

Therefore, the industry tends to eliminate contact resistance affection first when encountering a bottleneck in the testing debugging phase. However, in fact, the design of the current testing device still may not meet the above requirements.

SUMMARY OF THE INVENTION

The invention provides a pogo pin-free testing device for IC chip test that may further eliminate contact resistance affection in the test process to obtain precise test results.

The invention also provides a testing method of IC chip suitable for ASIC testing.

A pogo pin-free testing device for IC chip test of the invention includes a load board, a ceramic interposer disposed on the load board, and copper core balls. The ceramic interposer has a first surface, a second surface, and a plurality of connecting points. Each of the connecting points has a plurality of through holes penetrating the first and second surfaces, and the second surface of the ceramic interposer faces the load board. An inner sidewall surface of each of the through holes has a metallization layer, and the metallization layer is extended to a portion of the first surface and a portion of the second surface. In each of the connecting points, an area of an extending portion of the metallization layer extended to the second surface is less than an area of an extending portion thereof extended to the first surface. The copper core balls are disposed between the load board and the through holes of each of the connecting points of the ceramic interposer.

In an embodiment of the invention, the device may further include a plurality of contact components disposed on a surface of the load board facing the ceramic interposer, wherein each of the contact components is in electrical contact with each of the copper core balls.

In an embodiment of the invention, each of the contact components includes a main pad, a shadow pad, a wiring, and a solder mask. The shadow pad is separated from the main pad by a distance, and a size of the shadow pad is less than a size of the main pad. The wiring connects the shadow pad to the main pad. The solder mask is formed at a surface of the wiring.

In an embodiment of the invention, the shadow pad is in electrical contact with the copper core balls.

In an embodiment of the invention, the testing device may further include a solder ball formed on an extending portion of the metallization layer of each of the connecting points.

In an embodiment of the invention, a concentration of a surfactant contained in a solder forming the solder ball is inversely proportional to a size of each of the through holes.

In an embodiment of the invention, a number of the through holes in each of the connecting points of the ceramic interposer is 3 or more.

In an embodiment of the invention, the ceramic interposer may further include a stiffener disposed at a periphery of the ceramic interposer, and a thickness of the stiffener is greater than a thickness of a portion of the ceramic interposer having the connecting points.

A testing method of IC chip using the above device of the invention includes attaching an IC chip to the metallization layer of the connecting points on the first surface of the ceramic interposer using a first solder paste, and then performing a first reflow to connect the ceramic interposer to the IC chip, and a portion of the first solder paste penetrates into the through holes of the ceramic interposer. Then, the plurality of copper core balls are attached to the metallization layer of the plurality of connecting points on the second surface of the ceramic interposer using a second solder paste, and then a second reflow is performed, so that the ceramic interposer is bonded to the copper core balls. Then, the copper core balls are bonded to the load board.

In another embodiment of the invention, a temperature of the second reflow is less than a temperature of the first reflow.

In another embodiment of the invention, a melting point of the first solder paste is higher than a melting point of the second solder paste.

In another embodiment of the invention, a method of bonding the copper core balls to the load board includes attaching the copper core balls bonded to the ceramic interposer to the load board using a third solder paste, and then performing a third reflow.

Based on the above, the testing device of the invention discards the existing test socket device and uses a ceramic interposer and copper core balls instead, and the ceramic interposer has through holes. As a result, the solder ball of the IC chip may penetrate into the through holes and reduce the height thereof, so the distance effect of the thickness of the ceramic interposer may be reduced. Therefore, an IC chip (such as ASIC) may be bonded to a test load board by combining a ceramic interposer/copper core balls into a complete unit to eliminate contact resistance affection so as to achieve "directly-mounted like" test verification.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
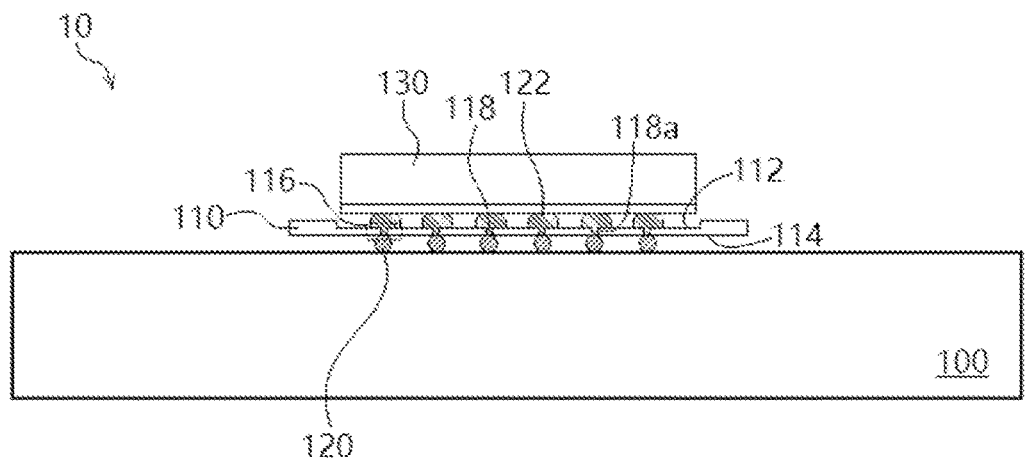
FIG. 1 is a schematic cross-sectional view of a pogo pin-free testing device for IC chip test according to the first embodiment of the invention.

Embodiments are provided hereinafter and described in detail with reference to figures. However, the embodiments provided are not intended to limit the scope of the disclosure. Moreover, the figures are only descriptive and are not drawn to scale. For ease of explanation, the same devices below are provided with the same reference numerals. Moreover, terms such as "contain", "include", and "have" used in the specification are all open terms, i.e., contains, but not limited to. Moreover, directional terms used in the specification such as "up" and "down" are only directions used in the figures. Therefore, the directional terms are used to illustrate and are not intended to limit the invention.

FIG. 1 is a schematic cross-sectional view of a pogo pin-free testing device for IC chip test according to the first embodiment of the invention.

Referring to FIG. 1, a pogo pin-free testing device 10 for IC chip test of the first embodiment includes a load board 100, a ceramic interposer 110 disposed on the load board 100, and copper core balls 120. The ceramic interposer 110 has a first surface 112, a second surface 114, and a plurality of connecting points 116. Each of the connecting points 116 has a plurality of through holes 118 penetrating the first surface 112 and the second surface 114, and the thickness of the ceramic interposer 110 may be less than 1 mm, such as less than 0.5 mm or less than 0.3 mm. Although each of the connecting points 116 in FIG. 1 only shows one through hole 118, it should be understood that this figure is a cross-sectional view, so there are other through holes 118 not shown in FIG. 1 in different cross-sections. The copper core balls 120 are disposed between the through holes 118 of each of the connecting points 116 of the ceramic interposer 110 and the load board 100. In the present embodiment, an inner sidewall surface 118a of each of the through holes 118 has a metallization layer (not shown), and the metallization layer is extended to a portion of the first surface 112 and a portion of the second surface 114. The ceramic has low warpage characteristics, and the low warpage rate is beneficial to the function of the copper core balls 120, so that there is a good electrical connection between the ceramic interposer 110 and the load board 100. The copper core balls 120 generally refer to spheres for which the core portion is copper and the surface is coated with nickel and solder. Because the core copper material of the copper core balls 120 has a melting point of up to 1080° C., which is much higher than the reflow temperature, the core copper material does not melt during reflow, so the weight of an IC chip 130 and the ceramic interposer 110 may be strongly supported during reflow, so as to avoid the issue of solder collapse during reflow. In addition, the distance between the IC chip 130 and the load board 100 may be reduced to less than 1 mm, so compared with a pogo pin testing device, contact resistance affection may be significantly reduced.

In an embodiment, the testing device 10 may further include a solder ball 122 formed on the extending portion of the metallization layer of each of the connecting points 116, and the IC chip 130 to be tested is bonded on the ceramic interposer 110, wherein the position of the solder ball 122 is, for example, between the pad of the IC chip 130 and the connecting points 116 of the ceramic interposer 110, and the effect of electrically bonding the IC chip 130 and the ceramic interposer 110 may be achieved through reflow. Since the solder forming the solder ball 122 penetrates into the through holes 118 during the reflow process, the height of the solder ball 122 after reflow is reduced, shortening current path, and reducing the distance effect of the thickness of the ceramic interposer 110. That is, the IC chip 130 and the copper core balls 120 are more closely connected via the molten solder ball 122, which is beneficial to reduce resistance. The degree of penetration of the solder ball 122 into the through holes 118 may be to completely fill the through holes 118 or penetrate into a portion of the through holes 118.

Moreover, the concentration of the surfactant contained in the solder used to form the solder ball 122 may be adjusted to match the weight of the IC chip 130 and the structure of the ceramic interposer 110. Considering the IC chip 130 having the same weight, the concentration of the surfactant of the solder may be inversely proportional to the size of each of the through holes 118. Because the concentration of the surfactant in the solder changes the surface tension of the solder to the object to be soldered (structure), the higher the concentration of the surfactant in the solder, the better the dispersibility of the solder; conversely, the lower the concentration of the surfactant in the solder, the worse the tin-scattering property of the solder. Therefore, when the through holes 118 are larger, the dispersibility of the solder does not need to be very high, and therefore the concentration of the surfactant in the solder may be slightly reduced to ensure liquid solder penetrates into the through holes 118 to fill up without leaking; when the through holes 118 are smaller, it is necessary to slightly increase the concentration of the surfactant in the solder so that the solder may be expanded smoothly and penetrate into the through holes 118. For example, the original concentration of the surfactant in the solder is 1 wt %, and the surface tension may be reduced by increasing the concentration to 1.3 wt % or 1.5 wt %. Based on the above, in the invention, the weight of the IC chip 130 and the surface tension of the solder may be balanced, so that liquid solder may flow into the through holes 118 without leaking from the bottom.

Figure 2:
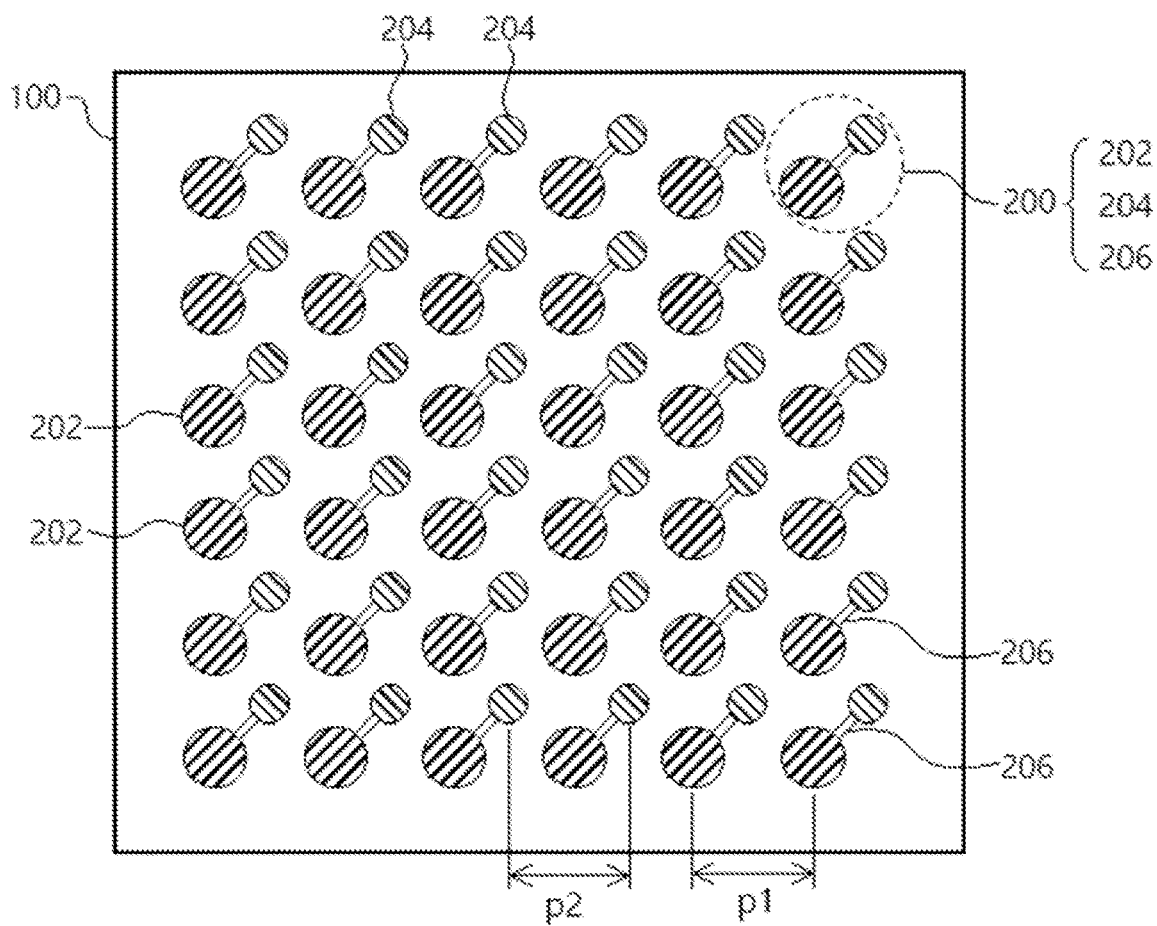
FIG. 2 is a top view of a load board in the pogo pin-free testing device for IC chip test of FIG. 1.

FIG. 2 is a top view of a load board in the pogo pin-free testing device for IC chip test of FIG. 1.

Referring to FIG. 2, a plurality of contact components 200 may be disposed on the surface of the load board 100 facing the ceramic interposer, and each of the contact components 200 may be in electrical contact with each of the copper core balls (118 of FIG. 1). In the present embodiment, each of the contact components 200 may include a main pad 202, a shadow pad 204, a wiring 206, and a solder mask (not shown). The shadow pad 204 is separated from the main pad 202 by a distance, and the size of the shadow pad 204 is less than the size of the main pad 202. The wiring 206 connects the shadow pad 204 to the main pad 202, so the electrical connection between the shadow pad 204 and the main pad 202 is equivalent to one pad. The solder mask is formed at the surface of the wiring 206 to prevent the solder from reflowing to the main pad 202 during the reflow process. In an embodiment, the size of the main pad 202 is, for example, 0.6 mm, a pitch p1 between the main pads 202 is, for example, 1.0 mm, the size of the shadow pad 204 is, for example, 0.4 mm, and a pitch p2 between the shadow pads 204 is, for example, 1.0 mm. However, the invention is not limited thereto, and the size of the structure may be changed according to the design of the IC chip to be tested. The size of the main pad 202 is the same as or slightly less than the size of the pad on the traditional load board. Due to space constraints, the size of the shadow pad 204 is approximately 0.33 times the size of the main pad 202, or the size of each of the shadow pads 204 is similar to the projected area of a single copper core ball (118 of FIG. 1), so that the shadow pad 204 is in electrical contact with the copper core ball, but the copper core ball is not in contact with the shadow pad 204 and the main pad 202 in another contact component 200, and after the copper core ball is removed, the main pad 202 does not have any residual solder. Therefore, the load board 100 in the pogo pin-free testing device 10 of the present embodiment may be used for testing with the ceramic interposer and the copper core balls in FIG. 1; if contact resistance affection is not considered, the load board 100 may also be used in the current testing device of a test socket (not shown) having a pogo pin, and the size of the main pad 202 may be designed to a size at which the pogo pin may suitably be in contact. However, the invention is not limited thereto; in another embodiment, the contact components of the pogo pin-less testing device 10 for IC chip test may omit the main pad 202 and the wiring 206, and only retain the shadow pad 204.

Figure 3A:
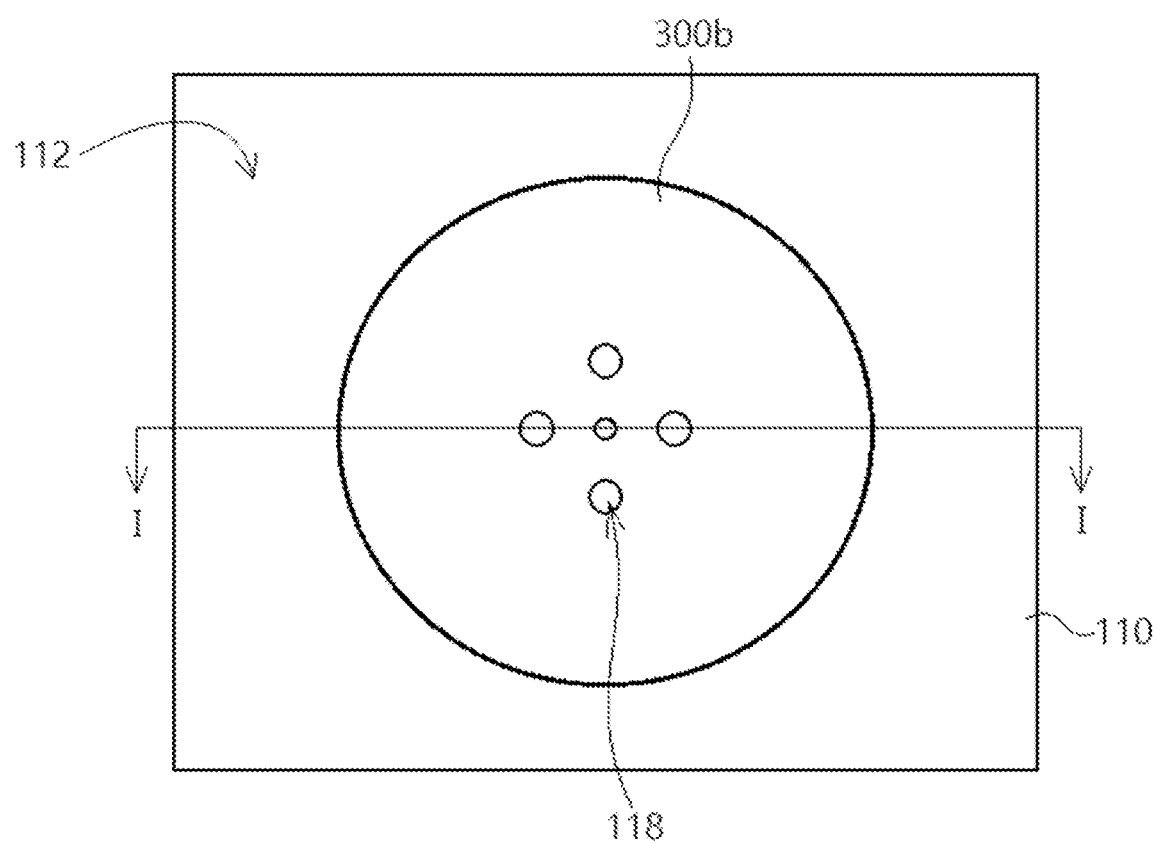
FIG. 3A is a schematic front view of the connecting points of the ceramic interposer in FIG. 1.
Figure 3B:
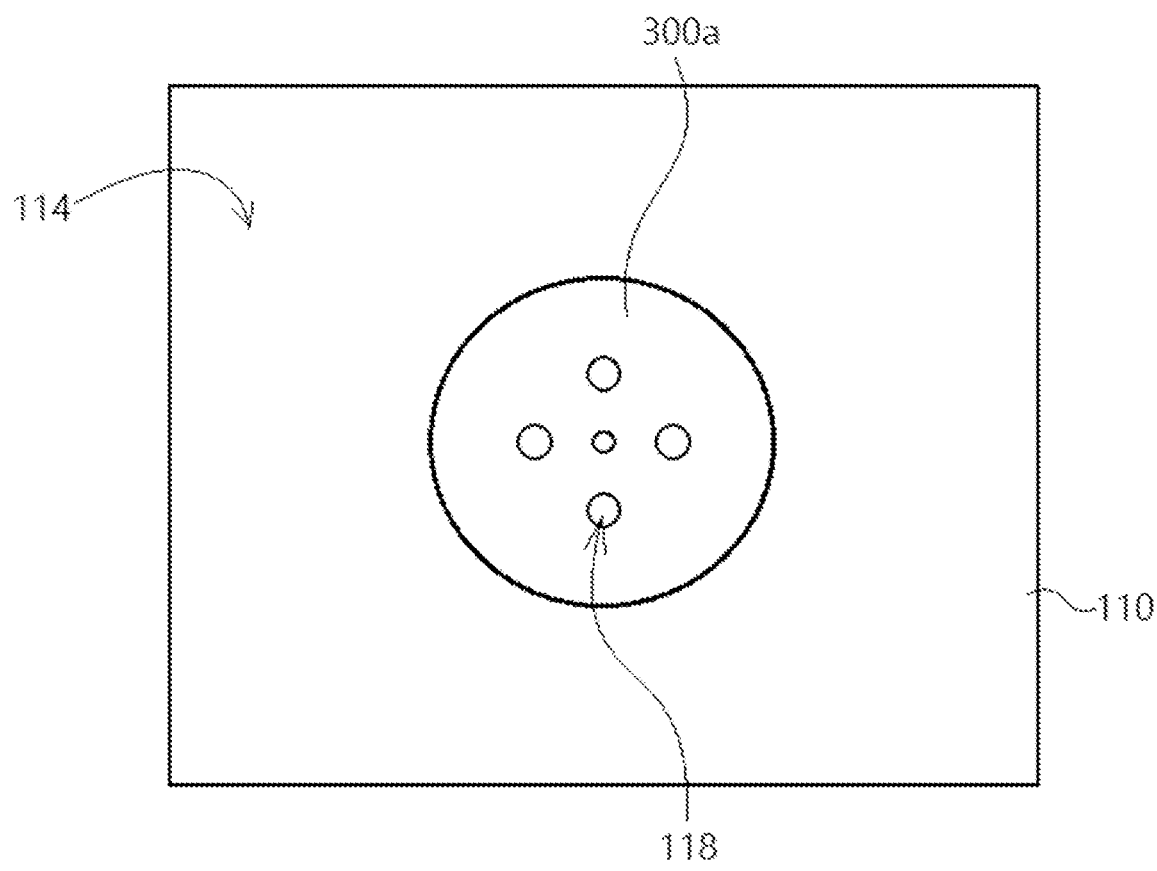
FIG. 3B is a schematic back view of the connecting points of the ceramic interposer of FIG. 3A.
Figure 3C:
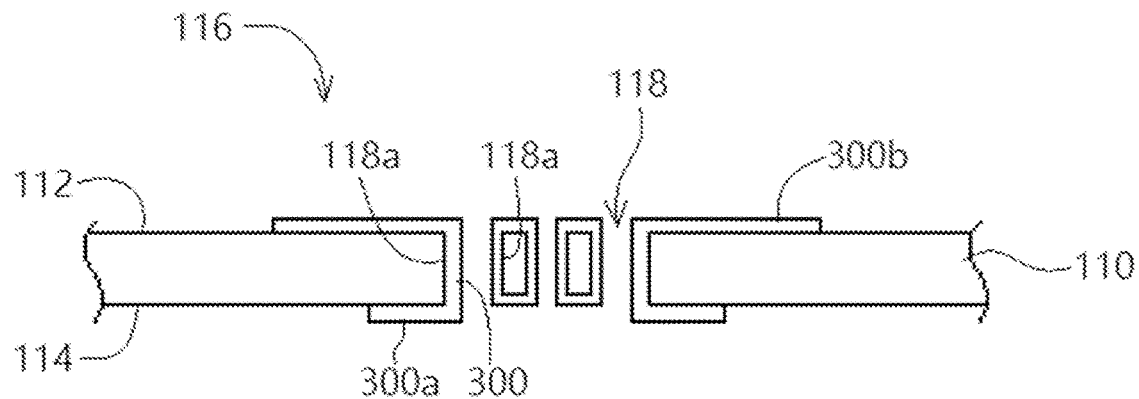
FIG. 3C is a schematic cross-sectional view of the connecting points of the ceramic interposer of FIG. 3A along line I-I.

In order to better understand the detailed structure of the connecting point 116 portion of the ceramic interposer 110, please refer to FIG. 3A, FIG. 3B, and FIG. 3C at the same time, wherein FIG. 3A is a front view, FIG. 3B is a back view, and FIG. 3C is a schematic cross-sectional view along line I-I in FIG. 3A. In the first embodiment, each of the connecting points 116 has the plurality of through holes 118 penetrating the first surface 112 and the second surface 114, and the number of the through holes 118 in each of the connecting points 116 may be increased or decreased according to requirements. As shown in FIG. 3A, the number of the through holes 118 is five, but the invention is not limited thereto, and the number of the through holes 118 may be three or more. In FIG. 3C, the inner sidewall surface 118a of the through holes 118 has a metallization layer 300, and the metallization layer 300 may be extended to a portion of the first surface 112 and a portion of the second surface 114. When the second surface 114 of the ceramic interposer 110 faces the load board (100 of FIG. 1), the area of an extending portion 300a of the metallization layer 300 in the connecting points 116 extended to the second surface 114 is less than the area of an extending portion 300b thereof extended to the first surface 112. On the one hand, the solder ball 122 (the diameter of which is 0.5 mm, for example) of FIG. 1 may be laid on the extended portion 300b of the metallization layer 300 having a larger area; on the other hand, the copper core balls 120 (with a ball diameter of, for example, 0.2 mm) of FIG. 1 may be bonded to the extending portion 300a of the metallization layer 300 having a smaller area. In addition to the round holes as shown in the figure, the through holes 118 may also be square holes or holes of other shapes.

Figure 4:
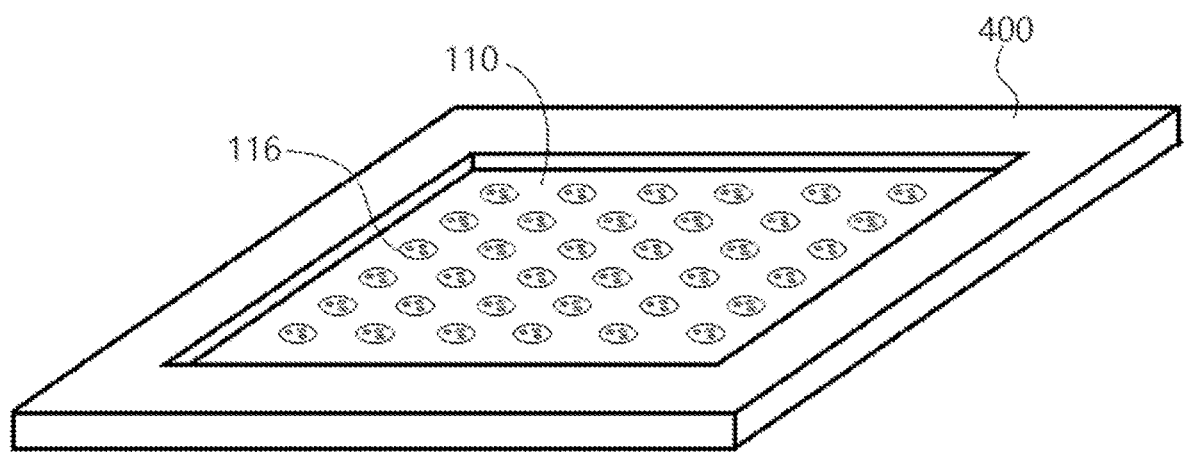
FIG. 4 is a stereoscopic schematic diagram of a ceramic interposer in the pogo pin-free testing device for IC chip test of FIG. 1.

FIG. 4 is a stereoscopic schematic diagram of a ceramic interposer in the pogo pin-free testing device for IC chip test of FIG. 1.

Please refer to FIG. 4, the material of the ceramic interposer 110 may be a ceramic having low warpage characteristics (compared to an FR4 board). If compared with boards of the same specification, the flexural strength of an FR4 PCB board is about 441 MPa, and the flexural strength of a ceramic PCB board is about 650 MPa. Moreover, the ceramic interposer 110 may include a stiffener 400 to further reduce the warpage rate. The stiffener 400 is disposed at the periphery of the ceramic interposer 110, and the thickness of the stiffener 400 is greater than the thickness (for example, about 0.3 mm) of the portion of the ceramic interposer 110 having the connecting points 116. If the stiffener 400 and the ceramic interposer 110 are made of the same material, they may also be made into an integrated structure.

If a ceramic PCB board of 70 mm×70 mm and a thickness of 0.32 mm is used as a control, and the simulation software Inventor is used to simulate the center to withstand a force of 100 N, then the deformation thereof is about 0.4975 mm. An integral stiffener (100 mm×100 mm, thickness of 10 mm) is added to the periphery of the ceramic PCB board, and the deformation obtained by the same simulation is about 0.06877 mm. Therefore, adding a 30 mm wide and 10 mm thick stiffener at the periphery of the original ceramic PCB board may reduce deformation by about 86.2%.

FIG. 5A to FIG. 5E are schematic flowcharts of a testing method of IC chip according to the second embodiment of the invention, wherein the same reference numerals as those in the first embodiment are used to indicate the same or similar parts and components, and related content of the same or similar parts and components is also as provided in the content of the first embodiment and is not repeated herein.

Referring to FIG. 5, a solder 500 containing a first solder paste is first used, and the concentration of the surfactant contained in the solder 500 may be adjusted according to requirements, and the solder 500 is laid at the metallization layer (the extending portion 300b) of the connecting points 116 on the first surface 112 of the ceramic interposer 110.

Figure 5A:
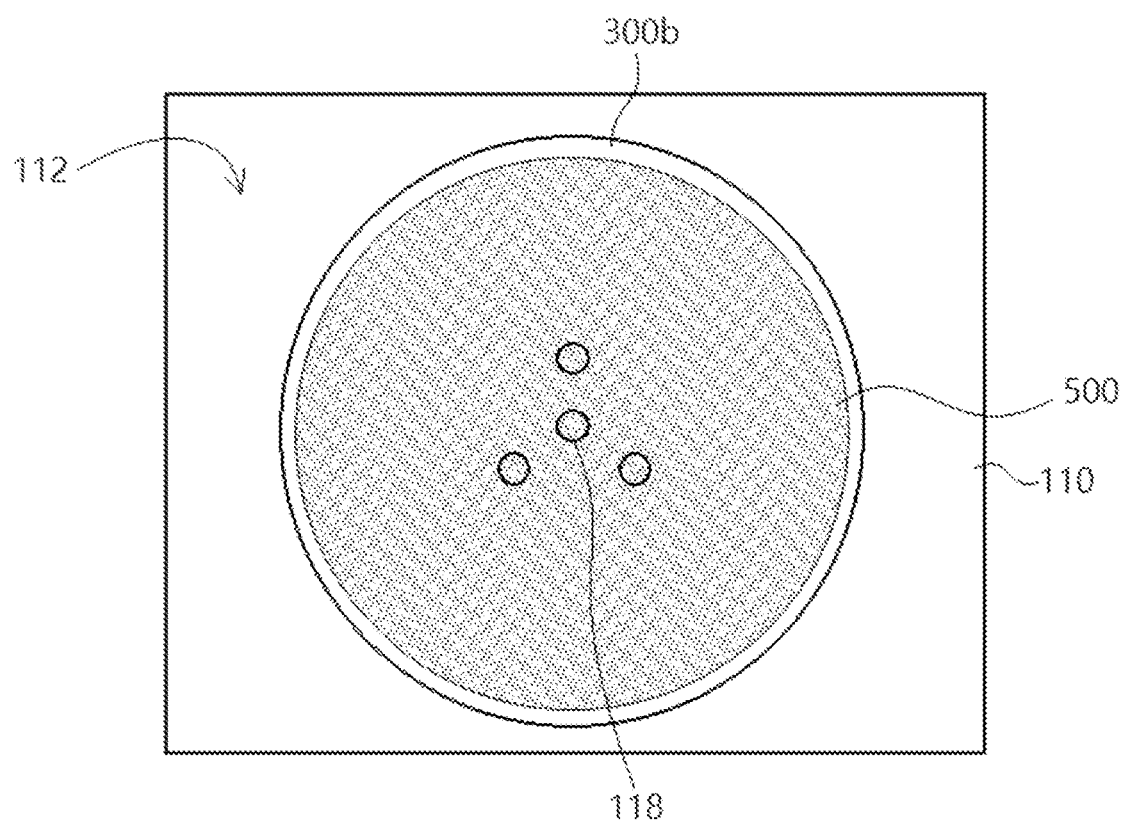
FIG. 5A to FIG. 5E are schematic flowcharts of a testing method of IC chip according to the second embodiment of the invention.
Figure 5B:
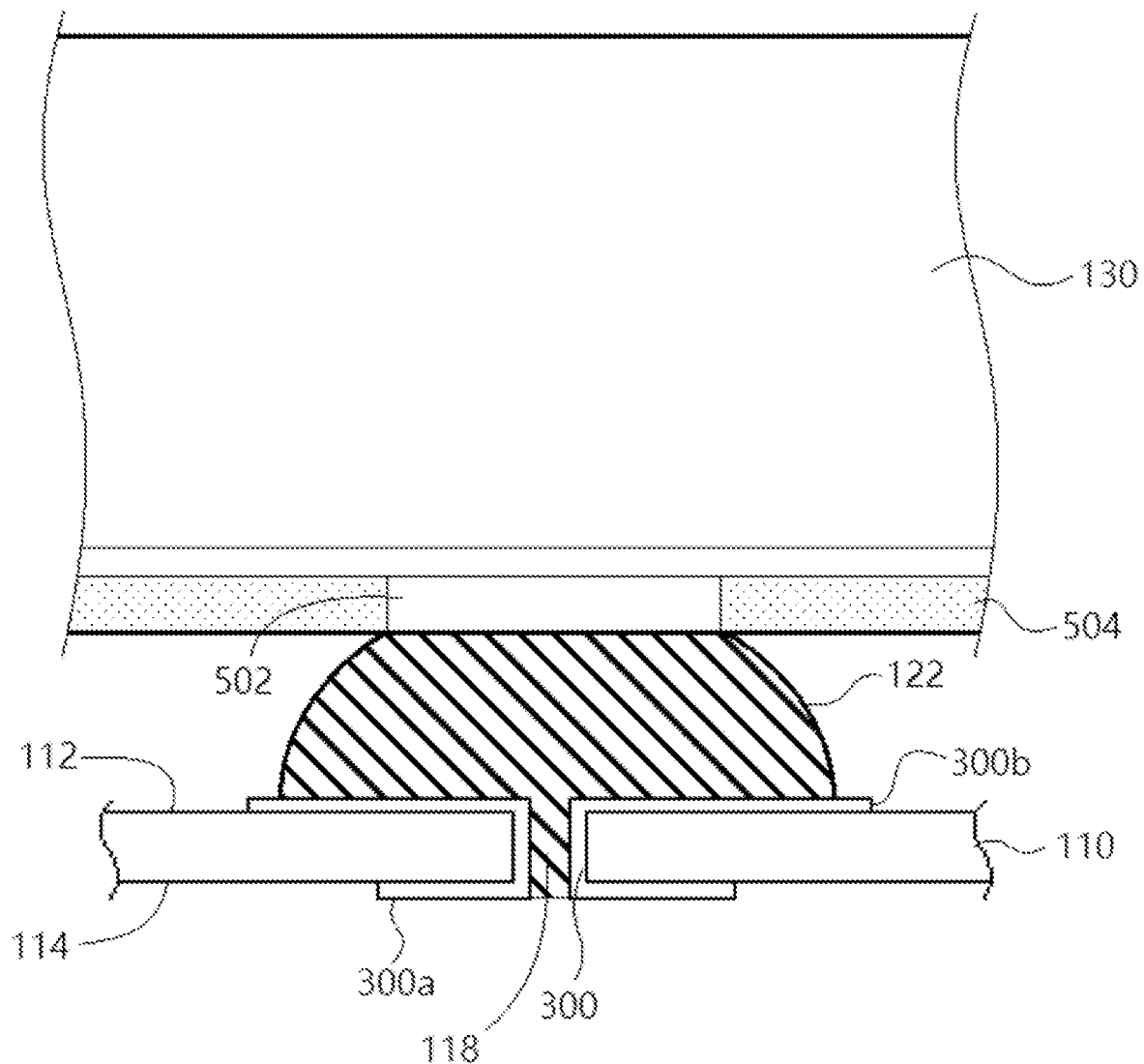

Then, referring to FIG. 5B, the IC chip 130 is attached to the extending portion 300b by solder (500 of FIG. 5A), and a first reflow is performed to bond the ceramic interposer 110 and the IC chip 130. In addition, a portion of the first solder paste penetrates into the through holes 118 of the ceramic interposer 110, so that the height of the solder ball 122 after reflow is reduced, thus shortening current path and reducing the distance effect of the thickness of the ceramic interposer 110. A pad 502 and a solder mask 504 are usually disposed between the IC chip 130 and the solder ball 122.

Figure 5C:
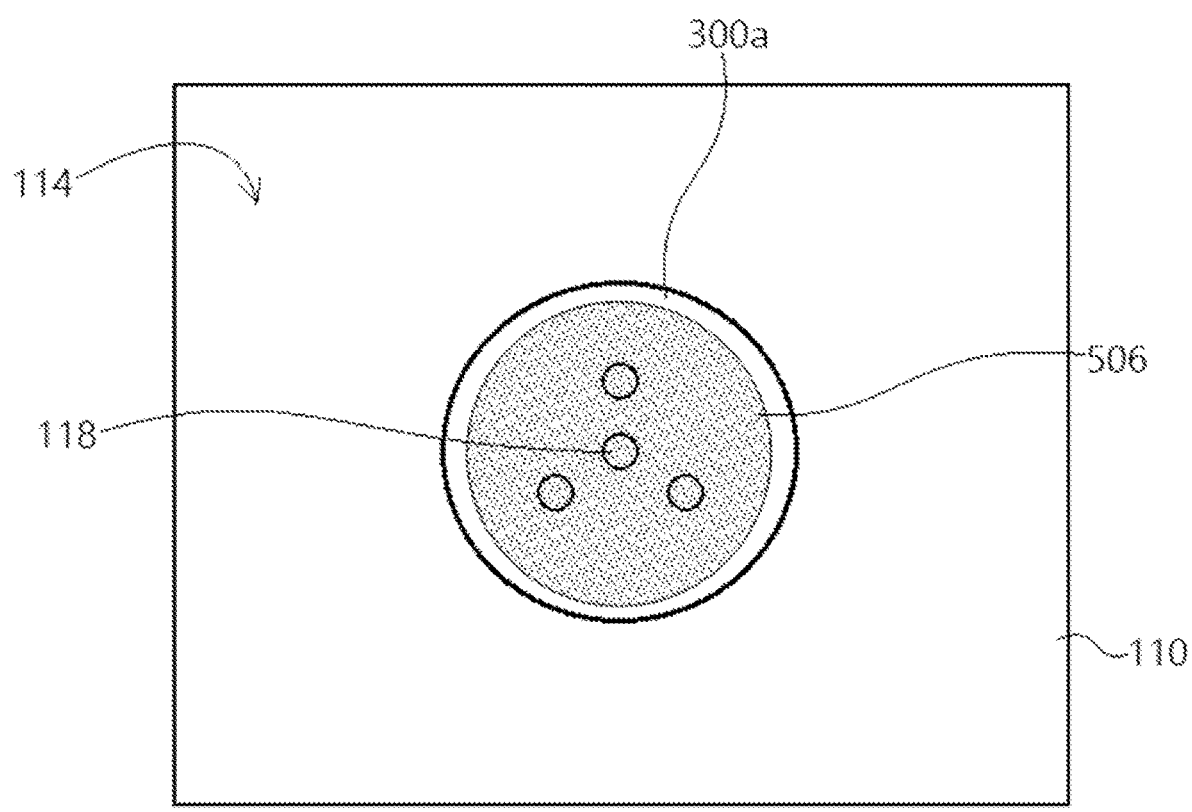

Next, please refer to FIG. 5C, a solder 506 containing a second solder paste is used, and the ceramic interposer 110 is turned over, so that the solder 506 is laid at the metallization layer (the extending portion 300a) of the connecting points 116 on the second surface 112 of the ceramic interposer 110.

Figure 5D:
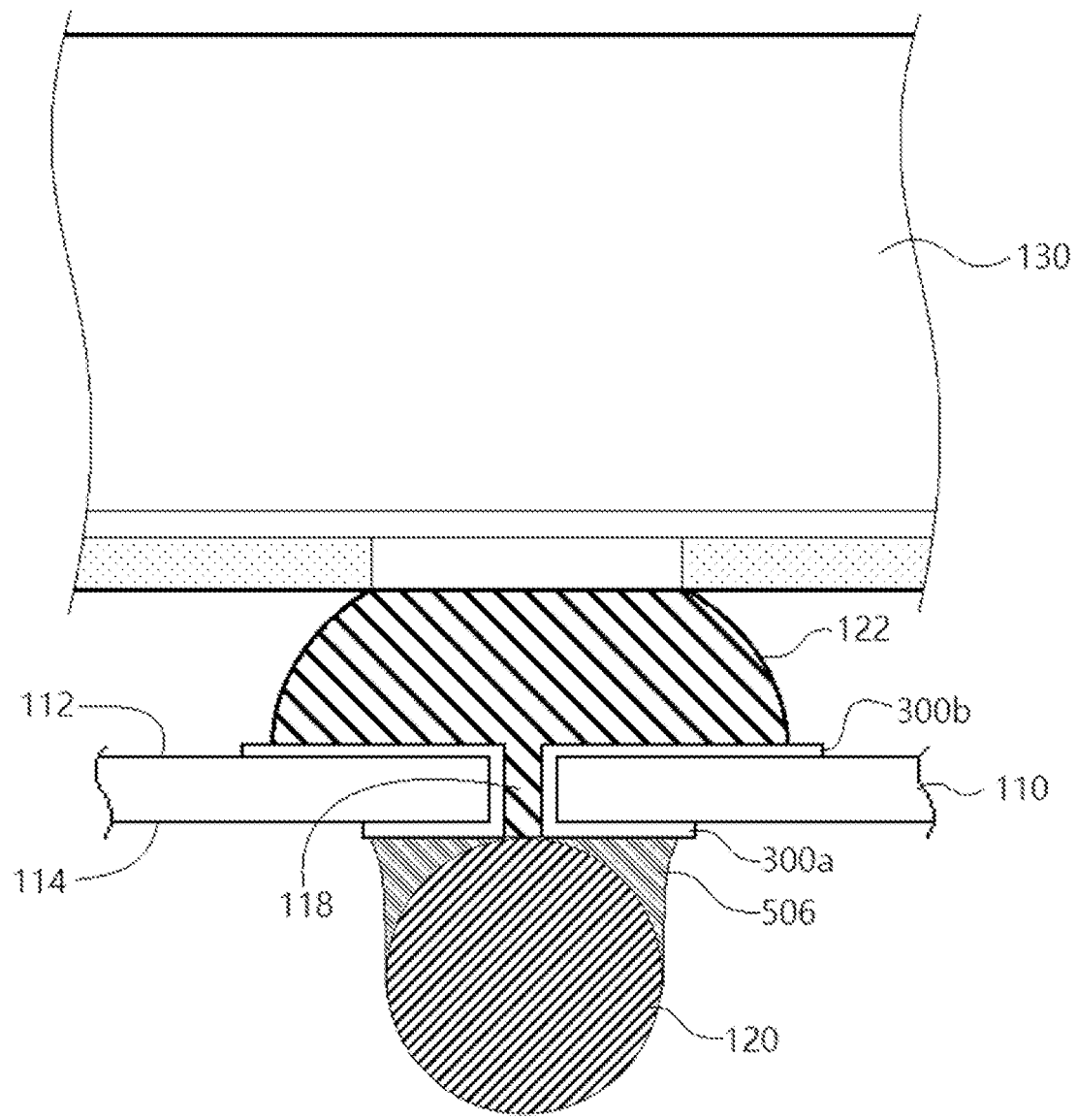

Then, referring to FIG. 5D, a number of copper core balls are placed on the solder 506 of the extending portion 300a, and a second reflow is performed, so that the ceramic interposer 110 and the copper core balls 120 are bonded. During the second reflow, the outer layer solder (containing tin paste) of the copper core balls 120 is melted, and the solder ball 122 may be connected to the outer layer solder of the copper core balls 120 via the through holes 118, as in interfaceless solder ball bonding. In an embodiment, the temperature of the second reflow is less than the temperature of the first reflow. In another embodiment, the melting point of the first solder paste is higher than the melting point of the second solder paste.

Figure 5E:
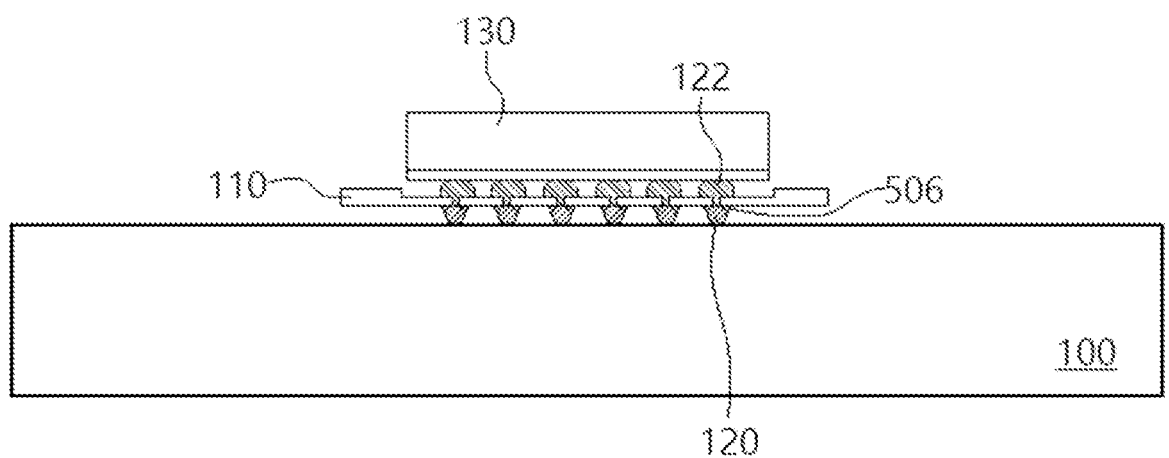

Next, referring to FIG. 5E, the copper core balls 120 are bonded to the load board 100. For example, the copper core balls 120 bonded to the ceramic interposer 110 are attached to the load board 100 using a solder (not shown) containing a third solder paste, and then a third solder reflow is performed. Therefore, the IC chip 130/ceramic interposer 110/copper core balls 120 are combined into a complete unit and bonded to the load board 100 to achieve the "directly-mounted like" test and verification purpose. Subsequent desoldering may be used to separate the load board 100 from the copper core balls 120, the ceramic interposer 110, and the IC chip 130 thereon. Since the contact components (200 of FIG. 2) on the load board 100 include the main pad, and the copper core balls 120 are soldered to the shadow pad, the IC chip 130 does not affect subsequent test production after the IC chip 130 is disassembled.

Based on the above, the testing device of the invention has a ceramic interposer and copper core balls, and the ceramic interposer has through holes. Therefore, in the process of bonding the IC chip, the solder penetrates into the through holes, so the distance effect of the thickness of the ceramic interposer may be reduced to avoid contact resistance affection. In addition, the concentration of the surfactant contained in the solder forming the solder ball may be customized to the desired surface tension behavior, so that liquid solder may flow into the through holes without leaking. The specific contact components on the load board provide the load board with a multi-functional testing method that may be used in the testing device of the invention, which may also be used in a test socket having a pogo pin. In addition, the ceramic interposer of the invention may also have a stiffener to enhance the anti-warping ability thereof so as to facilitate the use of copper core balls, so that there is good electrical connection between the ceramic interposer and the load board.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A pogo pin-free testing device for IC chip test, comprising:
    a load board;
    a ceramic interposer disposed on the load board, wherein the ceramic interposer has a first surface, a second surface, and a plurality of connecting points, and the second surface of the ceramic interposer faces the load board, each of the connecting points has a plurality of through holes penetrating the first surface and the second surface, an inner sidewall surface of each of the through holes has a metallization layer, the metallization layer is extended to a portion of the first surface and a portion of the second surface, and an area of an extending portion of the metallization layer in each of the connecting points extended to the second surface is less than an area of an extending portion thereof extended to the first surface;
    a plurality of copper core balls disposed between the load board and the plurality of through holes of each of the connecting points of the ceramic interposer; and
    a solder ball formed on an extending portion of the metallization layer of each of the connecting points, wherein the solder ball is between pads of the IC chip and the connecting points of the ceramic interposer.

2. The pogo pin-free testing device for IC chip test of claim 1, further comprising a plurality of contact components disposed on a surface of the load board facing the ceramic interposer, wherein one of the plurality of contact components is in electrical contact with one of the plurality of copper core balls.

3. The pogo pin-free testing device for IC chip test of claim 2, wherein each of the contact components comprises:
    a main pad;
    a shadow pad separated from the main pad by a distance, and a size of the shadow pad is less than a size of the main pad;
    a wiring connecting the shadow pad to the main pad; and
    a solder mask formed on a surface of the wiring.

4. The pogo pin-free testing device for IC chip test of claim 3, wherein the shadow pad is in electrical contact with the copper core balls.

5. The pogo pin-free testing device for IC chip test of claim 1, wherein a concentration of a surfactant contained in a solder forming the solder ball is inversely proportional to a size of each of the through holes.

6. The pogo pin-free testing device for IC chip test of claim 1, wherein a number of the through holes in each of the connecting points of the ceramic interposer is 3 or more.

7. The pogo pin-free testing device for IC chip test of claim 1, wherein the ceramic interposer further comprises a stiffener disposed at a periphery of the ceramic interposer, and a thickness of the stiffener is greater than a thickness of a portion of the ceramic interposer having the plurality of connecting points.

8. A testing method of IC chip using the device of claim 1, comprising:
    attaching an IC chip to the metallization layer of the plurality of connecting points on the first surface of the ceramic interposer using a first solder paste;
    performing a first reflow to connect the ceramic interposer to the IC chip, and a portion of the first solder paste penetrates into the plurality of through holes of the ceramic interposer;
    attaching the plurality of copper core balls to the metallization layer of the plurality of connecting points on the second surface of the ceramic interposer using a second solder paste;
    performing a second reflow to bond the ceramic interposer and the copper core balls; and
    bonding the copper core balls to the load board.

9. The testing method of IC chip of claim 8, wherein a temperature of the second reflow is less than a temperature of the first reflow.

10. The testing method of IC chip of claim 8, wherein a melting point of the first solder paste is higher than a melting point of the second solder paste.

11. The testing method of IC chip of claim 8, wherein a method of bonding the copper core balls to the load board comprises:
   attaching the plurality of copper core balls bonded to the ceramic interposer to the load board using a third solder paste; and
   performing a third reflow.

\* \* \* \* \*